United States Patent [19]

Thomson

[11] Patent Number: 4,586,023
[45] Date of Patent: Apr. 29, 1986

[54] MEANS AND METHOD FOR DATA TRANSMISSION ON WIRED CHANNELS

[75] Inventor: Malcolm G. Thomson, Ontario, Canada

[73] Assignee: Motorola Information Systems Limited, Brampton, Canada

[21] Appl. No.: 617,974

[22] Filed: Jun. 6, 1984

[51] Int. Cl.[4] .................................................. H03M 7/00
[52] U.S. Cl. .................................... 340/347 DD; 375/7
[58] Field of Search ................... 340/347 DD; 360/40

[56] References Cited
U.S. PATENT DOCUMENTS 4,032,979  6/1977  Rice ............................. 340/347 DD Primary Examiner—William M. Shoop, Jr.
Assistant Examiner—Saul M. Bergmann

[57] ABSTRACT

An encoder for binary data encodes such data, two bits at a time into one of the four signals:

| H | H | L | L |
| H | L | L | H |
| L | L | H | H |
| L | H | H | L | where H and L represent high and low levels of the signal, where each of the four possible combinations of two data bits is in one-to-one correspondence with one of the four signals, each of the signals encompasses a baud having the duration of two bits at the primary data rate and the duration of each level is one quarter of the baud time.

15 Claims, 8 Drawing Figures

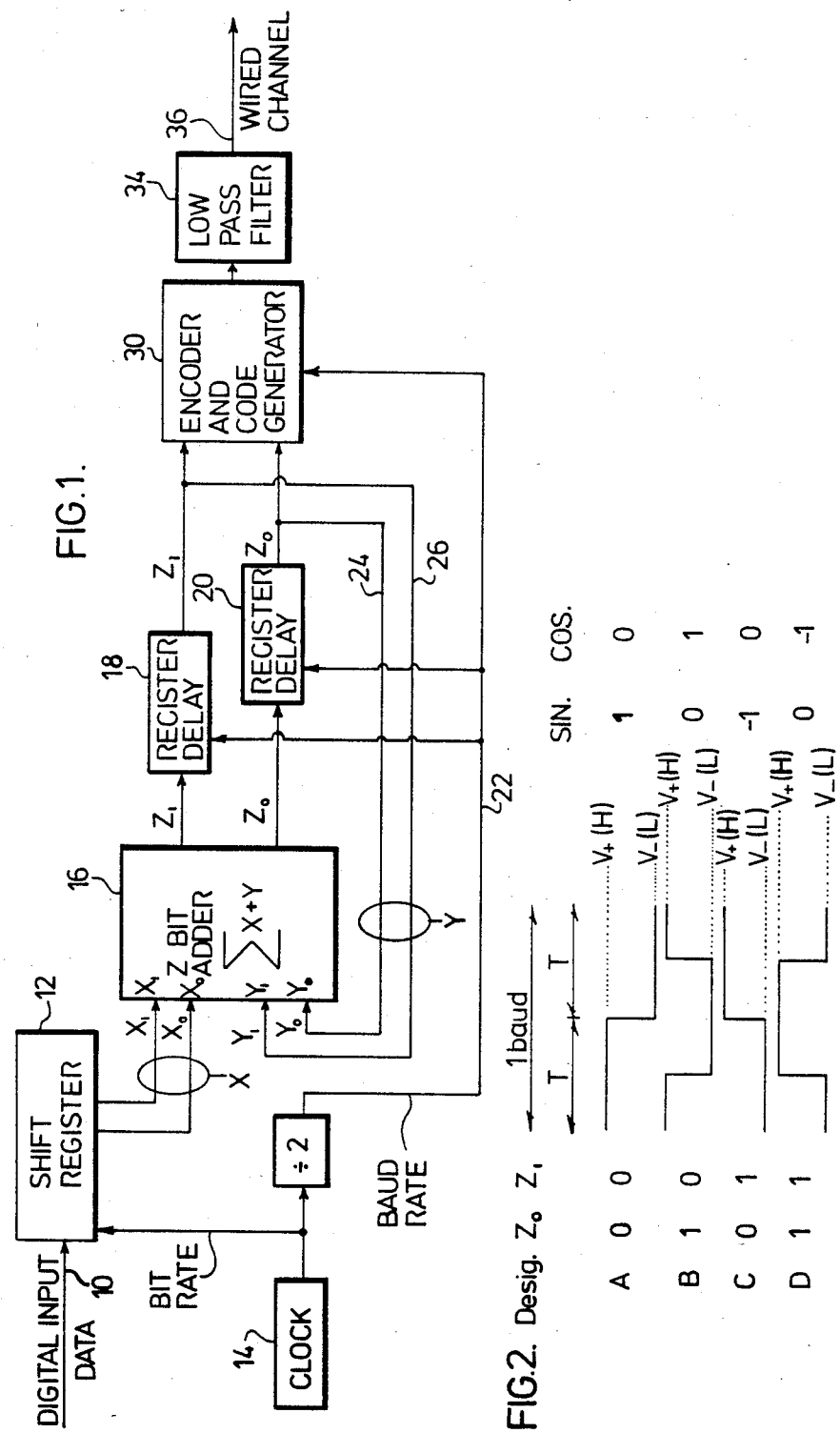

MEANS AND METHOD FOR DATA TRANSMISSION ON WIRED CHANNELS

This invention relates to the means and a method for providing local area data transmission over wired transmission channels.

With the tremendous proliferation of computing and terminal devices, and demand for data transmission, in industry and government, there has been and is a great demand for reliable and low cost transmission facilities for local area communications.

One of the main problems with existing modems for such local area transmission is that very simple encoders are used in the transmitter and very simple decoders are used in the receiver. With such simple components the receiver-decoder is very susceptible to noise and must be very well equalized. Equalization is the process in the receiver of cancelling the signal distortion due to the transmission line and restoring the signal, so far as possible to the form of the transmitted signal. The sensitivity of the decoding receivers to errors in equalization is a major problem in such local communications facilities, because it requires that the receiver be manually adjusted to each circuit application, or if an automatic equalizer is used, the maximum range of operation is reduced. Another problem with such existing modems and their connecting wired channel, is the high susceptibility to impulse noise on the wired channel due to cross-talk. Such impulse noise is often a result of dial or ring pulses on adjacent circuits. Problems due to inadequate equalization and impulse noise are increased where, as is commonly the case, twisted cables are used as channels for transmission of the data. These shortcomings of existing modems are important because they limit the performance of the modems in data transmission and the reliability of the received data.

It is an object of the invention to provide means and a method for data transmission wherein, at the transmitter, the signals are simply encoded as high and low voltage levels H and L (i.e. without modulation on a carrier) but, at the receiver, are demodulated as if they had been subjected to linear modulation at the transmitter. This approach provides considerable advantages over prior transmission systems in the performance of the receiver due to its improved tolerance to impulse noise and to errors in equalization.

In a preferred form of the means and method, the signal shapes used at the encoder for signalling the encoded binary data are chosen to facilitate the demodulation and decoding at the receiver.

In a preferred form of the invention successive bits of binary data to be transmitted on a wired channel are encoded in the form of one of the four signals:

| H | H | L | L |
| H | L | L | H |
| L | L | H | H |
| L | H | H | L | where each of the four possible combinations of the two data bits is in one-to-one correspondence with one of the four signals, and where each of the signals encompasses a baud having the same duration as two bits at the binary data rate, the H and L represent high and low voltage levels of the signal, respectively, and the duration of each level present in said signals is one quarter of the baud time. (The high and low voltage levels are customarily embodied as the voltages $+V$ and $-V$ in the transmitted signals).

The preferred form of the invention provides, at the receiver, means and a method for demodulating the received signal, such means and method involving the use of:

first means for multiplying, in the analogue mode, the received signal by a sine approximating signal having the period of one of said four signals and being approximately synchronized therewith, second means for multiplying in the analogue mode, the received signal by a cosine approximating signal having the period of said sine signal and substantially synchronized therewith, and means for deriving the binary data bit pairs from the results of said multiplications.

Other objects and advantages of the invention will be apparent from the description of the specific embodiment to follow.

In drawings which illustrate a preferred embodiment of the invention:

FIG. 1 is a schematic diagram of the transmitter;

FIG. 2 shows the relationship of pairs of data bits to encoded signals representing them;

Figure 3:
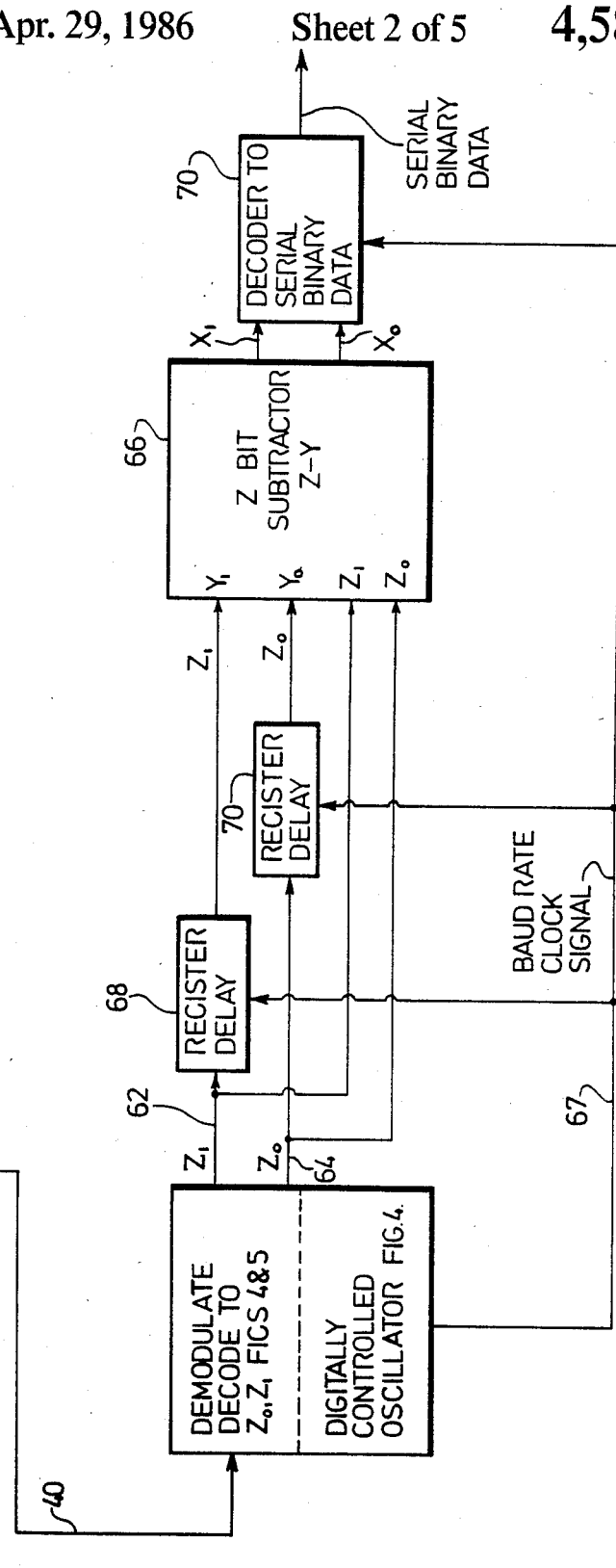
FIG. 3 is a schematic diagram of the receiver.

In FIG. 1 binary data received along wired channel 10 is clocked into two stage shift register 12 under the control of clock 14 operating at the bit rate of the binary data. In the system to be described the baud rate is ½ the bit rate.

The values of the bits in the shift register are continuously available as $X_0$, $X_1$ at two inputs of Z bit adder 16.

The pair of bits at inputs $X_0$ and $X_1$ of adder 16 are treated as a binary number and added to bits received at the inputs $Y_0$ and $Y_1$ (also treated as a binary number) to produce a sum, modulo 4.

The sum, modulo 4, obtained at adder 16, expressed as the binary quantities $Z_0$ and $Z_1$ for the register delays 18 and 20 which register the values $Z_0$, $Z_1$ on each count of the baud rate clock signal received along line 22. (It should here be noted that the shift register 12, clocked at the bit rate, steps two stages for each clocking to delays 18 and 20. The status of the shift register 12 which does not correspond to a baud rate count at delays 18, 20 is ignored.) The $Z_0$, $Z_1$ outputs of delay 18 are provided to encoder and code generator 30 as hereinafter described. The $Z_0$, $Z_1$ outputs of delay 18 and 20 become along lines 24, 26 the $Y_0$, $Y_1$ inputs of Z bit adder 16 and it will be noted that $Y_0$, $Y_1$ represents the value of $Z_0,Z_1$, one baud earlier than the value of $Z_0,Z_1$ represented by $X_0,X_1$. Thus the Z bit adder 16 sums these inputs and thereby achieves the differential encoding.

The outputs of register delays 18 and 20 are provided to the code generator 30 as clocked by the baud rate clock signal. The code generator provides in response to its received signals $Z_0,Z_1$ signals in the form of the voltage levels indicated in FIG. 2 over a one baud (two bit) interval in response to the $Z_0,Z_1$ inputs. (It will be noted that any arrangement of the signal forms A,B,C,D, in one-to-one correspondence to the pairs of Z values could have been used as long as the reverse assignment of values is performed at the decoder). FIG. 2 shows the letters A,B,C,D denoting the four possible bit pair combinations $Z_0,Z_1$ and opposite each of these the encoding wave form and, to the right the sine and cosine components of each wave form.

The squared contour signal forms shown in FIG. 2 and embodied as high and low voltage levels H and L embodied herein by voltages V+,V− and the FIG. 2 signal forms are somewhat rounded by the low pass filter 34 which is required in telephone company applications to eliminate high harmonics of the signals used. The output of filter 34 is transmitted on wired channel 36 to the receiver. It will be noted that the signal is encoded as voltage levels on channel 36 without modulation in one of four signal forms each of which is sent at a baud rate ½ the bit rate.

The receiver is shown in general form in FIG. 3. It will be obvious from the description to follow that the receiver clock signals and the operation at the receiver must be synchronized with the received transmitted signal which does not itself include a synchronization signal. In the initial description to follow it will be assumed that such synchronization exists and thereafter there will be described the synchronization means.

Figure 4:
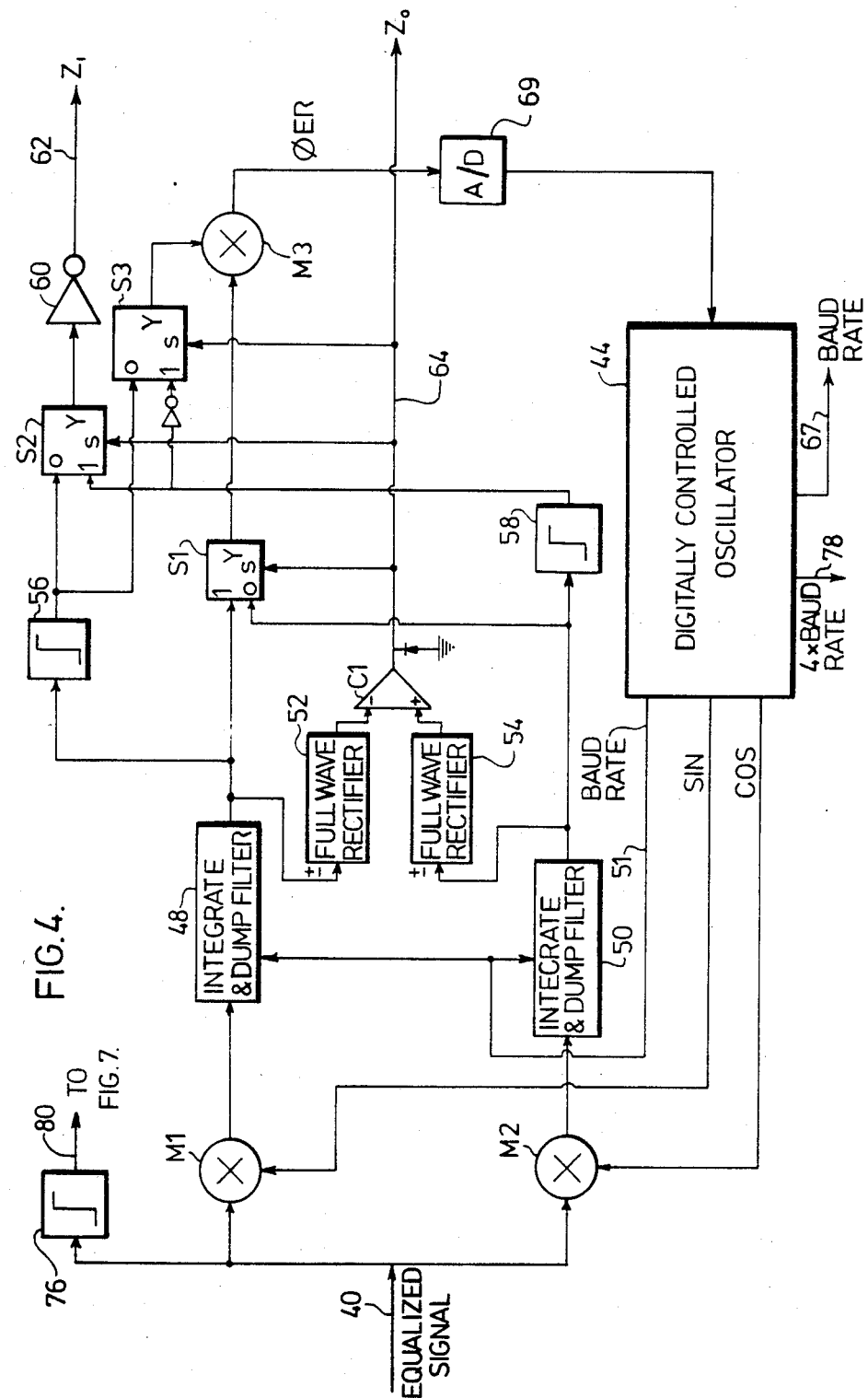
FIG. 4 is a more detailed schematic of the demodulating and decoding circuitry of FIG. 3.

As shown in FIG. 3 the signal from the transmitter on wired channel 36 is filtered and equalized at automatic equalizer and filter 38. The output of the automatic equalizer and filter 38 is supplied on line 40 to the circuitry for demodulating and decoding $Z_0$ and $Z_1$, as shown in FIG. 4. As shown in FIG. 4 the signal on line 40 is provided on two paths to one input of each of the multipliers M1 and M2. The digitally controlled oscillator 44 provides a sine wave to the other input of multiplier M1 and, with the same time datum, a cosine wave to the other input of multiplier M2. The sine and cosine signals referred to above have the same one baud period as the received signals and are synchronized therewith, by means to be later described. Thus, each cycle of the sine or cosine wave coincides, to the precision of the synchronization, with one of the A,B,C or D signals received at the respective multiplier. It will be noted that the multiplication at multipliers M1 and M2 is performed in the analogue mode. It should be noted that the sine and cosine waves referred need not be of mathematically precise sine and cosine form but may be square of the form of signals A and B of FIG. 2. (It will be noted that the demodulation referred to in the specification and claims herein is embodied in the preferred embodiment by the multiplications performed at multipliers M1 and M2.)

The output of the multipliers M1 and M2 is supplied to integrate and dump filters 48 and 50 respectively. The integrate and dump filters are designed to integrate their respective inputs over the baud interval and, when clocked by baud interval clock signal over line 51 from oscillator 44, to supply an output signal corresponding to the respective multiplier product over the baud interval as defined by the baud rate signals from oscillator 44. The baud rate signals are synchronized, to define the beginning and end of the sine and cosine waves at the multipliers M1 and M2.

Comparing the sine and cosine wave shapes to the signals A,B,C,D shown in FIG. 2 it will be obvious that the outputs of the multipliers will be:

| For Received Signal | Sine Multiplier | Cos Multiplier |
| --- | --- | --- |
| A | K | 0 |
| B | 0 | K |
| C | −K | 0 |
| D | 0 | −K | where K is treated as '1' in the circuitry to be described.

The outputs of integrate and dump filters 48 and 50 are to supplied to, respectively, to full wave rectifiers 52 and 54 respectively. The full wave rectifiers are designed and connected to have the quality of taking the output from the integrate and dump filter which may be positive or negative and providing at their outputs a signal representative of the absolute value of the input. The differential amplifier C1 is designed to receive the inputs from the full wave rectifier and to provide a '0' output if the output of amplifier 52 is greater and a '1' output if the output of amplifier 54 is greater. It will be noted that the output of C1 corresponds to $Z_0$ of FIG. 2.

It will be noted that the output of C1 controls the operation of switches S1,S2 and S3. In each of these switches the inputs are denoted "0" and "1". When a 0 or 1 valued input is supplied to the 'S' terminal of the switch, the signal then respectively present at the "0" or "1" switch input is supplied to the output terminal Y.

The output of integrate and dump filter 48 is supplied to the input of slicer 56 and its output is supplied to the "0" input of S2. The output of integrate and dump filter 50 is supplied to slicer 58 and its output is supplied to input "1" of S2. Each slicer is a device designed to provide a signal 1 and 0 for positive and negative inputs respectively and the output of the slicer is indeterminate when its input is at or near zero. Accordingly, when the output of filter 48 is larger than that for filter 50 (indicating A or C signals being received) the slicer 56 will supply as +1 or 0 signal to input "0" of S2. The signal then received from slicer 58 to the "1" input of S2 will be indeterminate but this does not matter since the 0 signal at the S terminal will only provide the signal then at the switches '0' input at the output of S2. (Similarly when the output of slicer 56 is indeterminate, S2 will ignore this input due to the "1" at its S terminal). When the output of filter 50 is larger than that of filter 48 the B or D signal has been received. S2 will receive a "1" signal from differential amplifier C1 and the output of S2 will be 1 when B is received and 0 when D is received. The output of S2 is inverted at invertor 60. Outputs from S2 and the invertor 60 are shown below:

| Received | Output S2 | Output Invertor 60 |
| --- | --- | --- |
| A | 1 | 0 |
| B | 1 | 0 |
| C | 0 | 1 |
| D | 0 | 1 |

It will thus be realized that the output of the line 62 corresponds to $Z_1$. The outputs $Z_0$, $Z_1$ are (FIG. 3) supplied along lines 64 and 62 through register delays 68 and 70 respectively to the $Y_1,Y_0$ inputs of the Z bit subtractor 66. The signals $Z_1$ and $Z_0$ respectively are also directly supplied from lines 62 and 70 to the $Z_1,Z_0$ inputs respectively of Z bit subtractor 66. The Z bit subtractor is designed to calculate the difference being the signals at its $Z_1,Z_0$ inputs less the signals at the $Y_1,Y_0$ inputs in each case, with the signals at the inputs being treated as binary numbers. The $Z_1,Z_0$ inputs at subtractor 66 represent $Z_1,Z_0$ signals one baud later than the $Z_1,Z_0$ signals at the $Y_1,Y_0$ inputs, due to the presence of register delays 68 and 70 which are clocked by the baud rate signal on line 67 from the digitally controlled oscillator 44. Thus the $Z_1,Z_0$ inputs of the Z bit subtractor 66 represent the $Z_1,Z_0$ outputs of registers 18 and 20 of FIG. 2 (and the $Y_1,Y_0$ inputs of subtracts 66 represent the register outputs 1 baud earlier); while the $X_1,X_0$ outputs of subtractor 66 represent the $X_0,X_1$ inputs to the adder 16 of FIG. 2.

The differentially decoded bits $X_1,X_0$ are then converted to the original serial binary data at decoder 70 under the control of the baud rate clock signal on line 67.

The above description has proceeded on the assumption that the outputs of oscillator 44 were synchronized with the receive signal.

Figure 7:
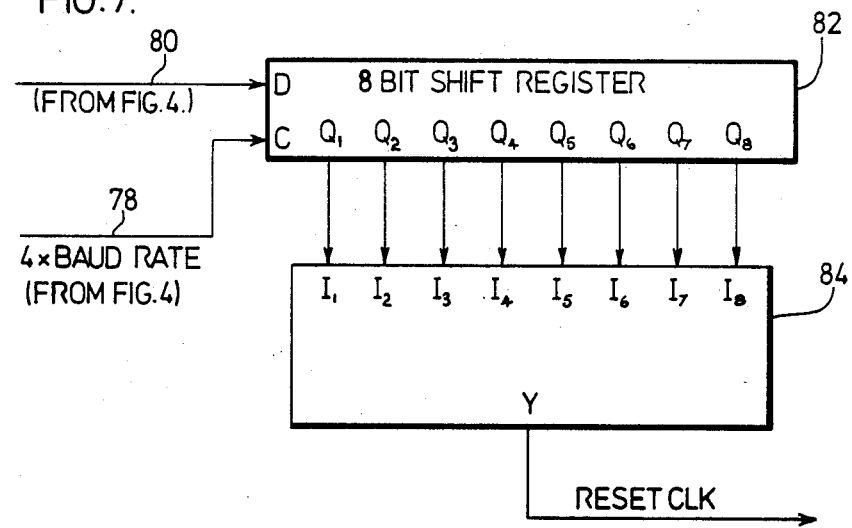
FIG. 7 shows circuitry for providing a coarse synchronization signal at the receiver.
Figure 8:
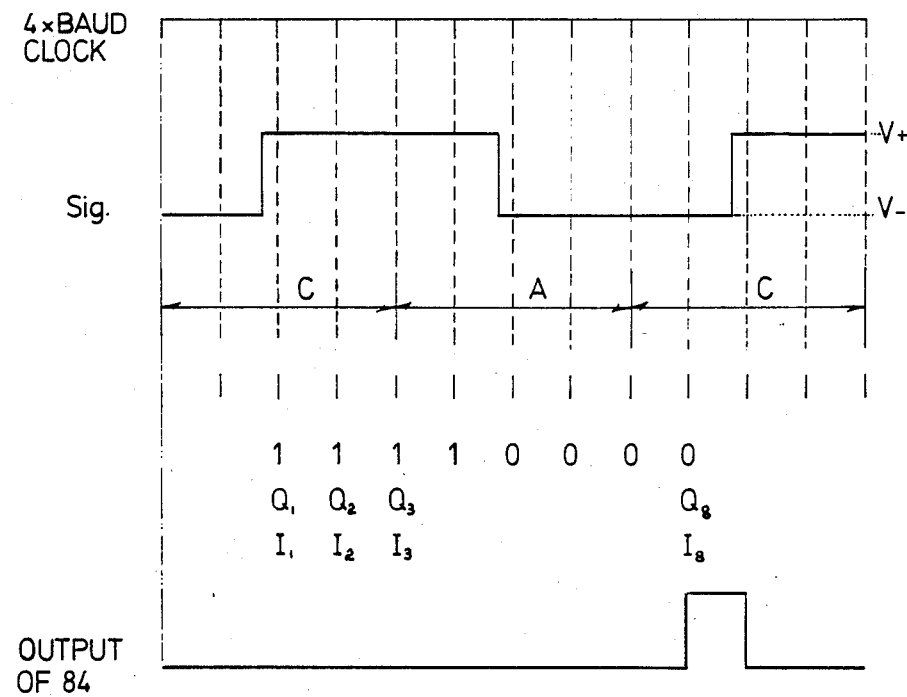
FIG. 8 shows the signal shapes at the circuitry of FIG. 7 to produce a synchronization pulse.

There will now be described the means for synchronizing the receiver. This means comprises a coarse synchronizing means and a fine synchronizing means and the former will be first described. As FIG. 4 shows, the received signal on line 40 from the automatic equalizer and filter 38 is supplied to a slicer 76 whose continuous output on line 80 is 0 or 1 depending on the state of the positive or negative sign of the received signal on line 40. The digitally controlled oscillator 44 is designed to provide a clock signal on line 78 at four times the baud rate. The signal on line 78 is supplied to and clocks shift register 82 whose input is connected to receive the slicer 76 output. The shift register 82 and logic 84 each carry eight stages Q1 to Q8. It will be noted that the eight stages correspond to positive or negative signal values over a two baud interval which, at every fourth clock signal, will contain two bauds having the 16 possible two-baud combinations of the A-D transmitted signal. It will also be noted that the four consecutive negative or four consecutive positive samplings are each unique among all sequences which could occur (whether the contents of the shift register coincides with two transmitted bauds or not). The logic of the block 84 is designed to detect the C-A-C or A-C-A sequences (the C-A-C sequence is shown graphically in FIG. 8). The preferred logic circuit is designed to detect either the C-A-C or A-C-A sequence and, responsive to such detection, to send a pulse to digitally controlled oscillator 44 at the beginning or the end (here the beginning) of such sequence. Such pulse at the time shown will correspond to a time near the mid-point of an "A" or "C" baud, and the digitally controlled clock is designed to adjust to such pulse to synchronize its sine and cosine outputs therewith. It will be noted that the digitally controlled oscillator may be simply designed to deal with a pulse from logic 84 at any other definite time in the baud interval than the one shown. It is customary to make the coarse adjustment at the beginning of each transmission by sending a training sequence of A-C-A-C... signals before commencement of the regular data transmission. It is then customary to disconnect the coarse adjustment circuit of FIG. 7 (by means not shown) during the actual data transmission so that, during such transmission, synchronization of the oscillator 44 with the received signal is controlled by the fine adjustment to be described hereafter. It will be noted that, theoretically, only four stages are required in the shift register 82 and logic 84 since the sequence 0,0,0,0, or 1,1,1,1 would have uniquely defined the sequences C-A or A-C respectively and the time boundary between bauds. However, the risk that one of the above 4 character sequences might be created erroneously by noise or the channel has rendered it safer practically to use the eight bit register and a repetitive binary sequence.

It will be noted that the above-designed coarse adjustment only achieves a degree of synchronism to a substantial fraction of the shift register 82 clocking rate.

The fine adjustment will now be described. As shown in FIG. 4 the outputs of integrate and dump filters 48 and 50 are respectively supplied to the "1" and "0" terminals of switch S1. The output of switch S1 is provided to one input of multiplier M3. The output of switch S1 is controlled by input S which receives the output of differential amplifier C1. Thus when the sine input (i.e. from rectifier 52) to the amplifier is higher than the cosine input "0" will appear at the "S" input of S1 and the output of (cosine) integrate and dump filter 50 is supplied to the multiplier M3. When the differential amplifier output is a "1" indicating that its cosine input is higher; then the output of (sine) integrate and dump amplifier 48 is provided to multiplier M3.

It is noted that the other input to multiplier M3 is received from switch S3 which has inputs from the slicers 56 and 58 with the input from slicer 58 being inverted. It will therefore be noted that the S3 originating input to multiplier M3 contains either the sign of the sine characteristic output of integrate and dump filter 48 or the inverted sign of the cosine characteristic output of integrate and dump filter 50. Although, each of the integrate and dump filters has, at times, indeterminate outputs, it will be noted that control of S3 by the output of the differential amplifier C1 provides that such indeterminate signals do not reach the input of M3.

Accordingly, the output of M3 will be either the output of filter 50 × the sign of the output of slicer 56 or the output of filter 48 × the inverted sign of the output of slicer 58.

Figure 5:
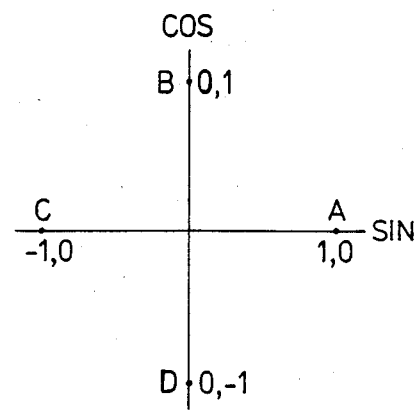
FIG. 5 shows graphically the relationship of the four possible transmitted signals.
Figure 6:
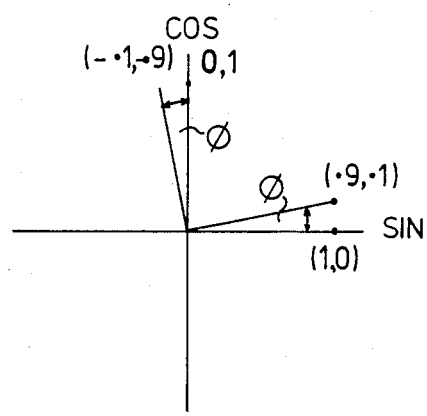
FIG. 6 shows graphically the relationship of transmitted signals to signals received with a phase error.

FIG. 5 shows the transmitted values of the signals A,B, C,D plotted in terms of sine and cosine, and FIG. 6 shows graphically the phase error $\phi$ of signals where the sine and cosine values as determined by the integrate and dump filters were (0.9,0.1) instead of the transmitted value of (1,0) or where the determined values were (−0.1,0.9) instead of the transmitted value of (0,1). In the case of the determined values of (0.9,0.1) it will be noted that the output of the $\phi$ER multiplier M3 will be (0.1X1=0.1) in the case of the determined values (−0.1,0.9) the output of the $\phi$ER multiplier M3 is −0.1X−1=0.1 where the latter component of the product, in each case, is the output of switch S3. It will be obvious that the output of multiplier M3 supplies a signal $\phi$ER which after conversion to a digital value at analogue to digital convertor 69 is a digital approximation of the phase error. This signal indicates, at a time corresponding to the arrival of each pulse from the baud rate clock to the integrate and dump filters, and approximation of the phase error of the clock signals from oscillator 44 and the digitally controlled oscillator is designed to be corrected in accord therewith.

Although particular and preferred methods have been disclosed for producing a clock at the receiver, synchronized with the received signal; the invention, in its broader aspects, extends to cover circuitry utilizing any method of achieving clock synchronism with the received signal at the receiver.

I claim:

1. Means for encoding binary data two bits at a time at a predetermined binary data rate into one of the four signals:

| H | H | L | L |
|---|---|---|---|
| H | L | L | H |
| L | L | H | H |
| L | H | H | L | where each of the four possible combinations of two data bits is in one-to-one correspondence with one of the four signals,
where each of the signals encompasses a baud having the same duration as two bits at the binary data rate, the H and L represent high and low voltage levels of the signal, respectively, and the duration of each level present in such signals is one quarter of the baud time,
said means for encoding binary data in combination with means for transmitting the levels of such signals onto a wired communications channel in unmodulated form.

2. Means as claimed in claim 1 combined with means for producing said binary data from other binary data by differential encoding.

3. Means located and connected to receive periodic unmodulated signals from a communications channel which signals were transmitted in the forms:

| H | H | L | L |
|---|---|---|---|
| H | L | L | H |
| L | L | H | H |
| L | H | H | L | representing the four possible forms of a pair of bits, where each of the values H or L represent high and low values of the transmitted form of the received signal and the duration of each H or L is equal,
means providing two paths for the received signal,
first means for multiplying, in the analogue mode, the signal on one path by a signal approximating a sine wave with a period equal to four times the said duration,
second means for multiplying in the analogue mode the signal on the other path by a signal approximating a cosine wave with the same period as said sine wave,
means for determining from the outputs of said first and second multiplying means, the bit pair represented by the received signal.

4. Means as claimed in claim 3 in combination with means for ensuring approximate synchronism of said sine and cosine signals comprising,
means for sampling the received signal at intervals spaced by said duration, recording the sequence of eight consecutive samplings,
means for detecting the recording of one of the sequences H H H H L L L L or L L L L H H H H and responsive thereto for providing a synchronization signal,
means responsive to said synchronization signal for altering the phase of said sine and cosine signals to bring them approximately into phase with the received signal.

5. Means as claimed in claim 3 in combination with means for ensuring approximate synchronization of said sine and cosine signals comprising, means for sampling the received signal at intervals spaced by said duration, recording the sequence of at least four consecutive sampling,
means for detecting the recording of one of the sequences H H H H or L L L L and responsive thereto for providing a synchronization signal,
means responsive to said synchronization signal for altering the phase of said sine and cosine signals to bring them approximately into phase with the received signal.

6. Means as claimed in claim 3 wherein said bit determining means comprises:
means for determining over comparable portions of the respective cycles of said sine and cosine waves, which of the outputs of said first and second multiplying means has the larger absolute value,
means for determining the sign of the output with the larger absolute value,
means responsive to the determination of said larger absolute value and said sign, for determining the bit pair corresponding thereto.

7. Means as claimed in claim 4 wherein said bit determining means comprises:
means for determining over comparable portions of the respective cycles of said sine and cosine waves which of the outputs of said first and second multiplying means has the larger absolute value,
means for determining the sign of the output with the larger absolute value,
means responsive to the determination of said larger absolute value and said sign, for determining a bit pair corresponding thereto.

8. Means as claimed in claim 6 including means responsive to the relationship of successive bit pairs for determining a bit pair characteristic of said relationship.

9. Means as claimed in claim 7 including means responsive to the relationship of successive bit pairs for determining a bit pair characteristic of said relationship.

10. Means as claimed in claim 6 including means for differentially decoding the bit pairs.

11. Means as claimed in claim 7 including means for differentially decoding the bit pairs.

12. Means as claimed in claim 1 combined with means connected to receive such signals from a communications channel, comprising
means providing two paths for the received signal,
first means for multiplying, in the analogue mode, the signal on one path by a signal approximating a portion of a sine wave with a period equal to four times the said duration,
second means for multiplying, in the analogue mode, the signal on the other path by a signal approximating a cosine wave with the same period as said sine wave,
means for determining from the outputs of said first and second multiplying means the bit pair represented by the received signal.

13. Means as claimed in claim 10 in combination with means for ensuring approximate synchronism of said sine and cosine signals comprising, means for sampling the received signal at intervals spaced by said duration, recording the sequence of eight consecutive sampling, means for detecting the recording of one of the sequences H H H H L L L L or L L L L H H H H and responsive thereto for providing a synchronization signal, means responsive to said synchronization signal for altering the phase of said sine and cosine signals to bring them approximately into phase with the received signal.

14. Means as claimed in claim 10 wherein said bit determining means comprises:

means for determining over comparable portions of the respective cycles of said sine and cosine waves which of the outputs of said first and second multiplying means has the larger absolute value, means for determining the sign of the output with the larger absolute value, means responsive to the determination of said larger absolute value and said sign, for determining a bit pair corresponding thereto.

15. Means as claimed in claim 6 including controllable means for controlling the phase of the sine and cosine approximating means, means for obtaining a measure of the value of the output of the multiplying means with the smaller absolute value, means responsive to the smaller absolute value and the sign of the output with the larger absolute value for deriving an approximation of the phase correction required to the said phase, means responsive to determination of said approximation to vary the phase of the sine and cosine approximating means in a sense to reduce said approximation.

* * * * *